United States Patent
Chandross et al.

[11] 3,953,620
[45] Apr. 27, 1976

[54] PRODUCING INTEGRATED OPTICAL CIRCUITS

[75] Inventors: Edwin Arthur Chandross, Berkeley Heights; Coralie Anne Pryde, Morristown; Walter John Tomlinson, III, Holmdel; Heinz Paul Weber, Middletown, all of N.J.

[73] Assignee: Bell Telephone Laboratories, Incorporated, Murray Hill, N.J.

[22] Filed: Dec. 6, 1974

[21] Appl. No.: 530,506

[52] U.S. Cl. .................................. 427/53; 96/35.1; 204/159.14; 204/159.16; 264/22; 350/96 WG; 427/54; 427/164
[51] Int. Cl.² ......................................... B05D 3/06
[58] Field of Search .............. 427/43, 164, 53, 165, 427/54; 204/159.16, 159.18; 96/35.1; 350/96 WG; 264/22

[56] References Cited
UNITED STATES PATENTS

| | | | |
|---|---|---|---|
| 3,084,116 | 4/1963 | Louthan | 204/159.18 |
| 3,175,992 | 3/1965 | Anderson | 204/159.18 |
| 3,372,100 | 3/1968 | Charlesby et al. | 204/159.17 |
| 3,689,264 | 9/1972 | Chandross et al. | 96/35.1 |
| 3,809,686 | 5/1974 | Chandross et al. | 96/35.1 |
| 3,809,732 | 5/1974 | Chandross et al. | 204/159.16 |
| 3,832,421 | 8/1974 | Morgan | 204/159.16 |
| 3,843,572 | 10/1974 | Morgan | 204/159.16 |

OTHER PUBLICATIONS

Kosar, J. "Light–Sensitive Systems," pp. 167 and 168, 1965.

*Primary Examiner*—Ronald H. Smith
*Assistant Examiner*—Sadie L. Childs
*Attorney, Agent, or Firm*—E. M. Fink

[57] ABSTRACT

A technique for the fabrication of integrated optical circuits is described wherein a transparent polymer film, which is doped with a polynuclear aromatic thiol having higher index of refraction than the polymer, is deposited from a liquid solution on a smooth substrate. Upon selective exposure to radiation there is a substantial reduction or elimination of the mobility and volatility of the dopant in the polymer matrix, a phenomenon known as "photolocking". The described class of dopant permits the attainment of higher resolution than previously reported, as well as the preparation of optical direction couplers having higher coupling strengths than those of the prior art.

3 Claims, 5 Drawing Figures

PRODUCING INTEGRATED OPTICAL CIRCUITS

FIELD OF INVENTION

This invention relates to a technique for the fabrication of optical waveguides in thin polymer films. More particularly, the present invention relates to the fabrication of optical waveguiding devices utilizing a photolocking process.

DESCRIPTION OF PRIOR ART

Recently, a technique commonly referred to as photolocking was described in U.S. Pat. No. 3,809,732. The patented technique was directed to the fabrication of integrated optical circuits wherein a spatially selective variation of refractive index and/or thickness of transparent polymers was effected by means of the photolocking phenomenon.

Briefly, the invention therein described involved the deposition of a polymer film, doped with a higher index (of refraction) photosensitive monomer, from solution upon a substrate, the dopant either attaching to the polymer, dimerizing or polymerizing upon selective irradiation. Studies revealed that the noted attachment, dimerization or polymerization process, resulted in either a marked reduction or total elimination in both the mobility and volatility of the dopant in the polymer matrix, the so-called photolocking phenomenon. Following, heating is effected to evaporate remaining unexposed dopant, the exposed dopant remaining positioned in the polymer film.

Devices subsequently fabricated from the described films were found to evidence smooth index and thickness profiles between dielectric regions, a characteristic required for minimizing scattering loss in guided optical waves. Additionally, it was found that high spatial resolutions, typically limited to two micrometers, were attainable. Although such devices were found satisfactory from most standpoints, workers in the art continued their investigative efforts with a view toward the development of higher resolution in combination with the facility for fabricating not only low loss single mode optical waveguides, but also gratings and directional couplers having a high coupling strength.

SUMMARY OF THE INVENTION

In accordance with the present invention, these desiderata are attained by the substitution of a novel class of dopants for the dopants employed in the known photolocking process. In summary, the present invention is based upon the discovery of a novel technique for fabricating integrated optical circuits by means of a photolocking process utilizing polynuclear aromatic thiols as the high index dopant. The thiols employed are of the general formula

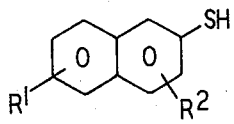

wherein $R^1$ is selected from among hydrogen and thiol groups and $R^2$ is selected from among chlorine and $C_1$–$C_2$ alkoxy or alkyl groups. Upon exposure to light, the dopant and/or polymer undergo photochemical reactions, which result in the desired substantial reduction of dopant mobility, thereby locking or implanting the dopant in the film. It has been found that the described thiols undergo photochemical addition to the reactive side groups of the polymer rather than photodimerization, so resulting in higher resolution than that attained in the original system. The described technique, as noted, permits the preparation of low loss single mode optical waveguides and optical directional couplers evidencing coupling strengths an order of magnitude greater than those made heretofore. Additionally, the resolution permits the fabrication of short period ($\leq 0.3\mu m$) grating couplers having coupling strengths ranging up to at least 15 dB/cm, such gratings being the first to be made wherein the bulk index of the guiding film is modulated. Photolocking materials utilized heretofore could not be employed in fabricating high periodicity gratings due to limited spatial resolution.

BRIEF DESCRIPTION OF THE DRAWING

The invention will be more readily understood by reference to the following detailed description taken in conjunction with the accompanying drawing wherein.

DETAILED DESCRIPTION OF INVENTION

As described in the aforementioned patent, a liquid solution of a transparent polymer in a solvent is prepared and doped with a high index photosensitive monomer. The polymer employed for the supporting thin film is similar to those described in the aforementioned patent. Thus, the base polymer of methyl methacrylate and glycidyl methacrylate is reacted with the monoethyl ester of fumaric acid and cinnamic acid to provide side groups having appropriate reactivity with thiols in addition to the ability to undergo photochemical crosslinking involving the cinnamate linkage.

The refractive index of the photosensitive monomer dopant is chosen to be as great as possible above that of the polymer in solution. The dopants, are as noted, polynuclear aromatic thiols having the naphthalene nucleus. The presence of either an alkyl or an alkoxy substituent upon the molecule increases molecular weight, thereby decreasing volatility. Studies have revealed that the substituents may also include halogen atoms, as for example, chlorine, or an additional thiol group. Although no absolute appears with respect to the limit of the length of the carbon chain substituents, practical considerations limit selection to the $C_1$–$C_2$ family. Increasing dopant concentration results in increased refractive index and thickness change attainable, a suitable dopant range being from 10–50% by weight. Although the invention has been described in terms of the naphthalene nucleus, it is apparent that the nucleus of the higher refractive index thiol dopant can be based upon other polynuclear aromatic systems similar to naphthalene in molecular weight and polarizability. Examples of such nuclei are thianaphthene, dibenzofuran, dibenzothiophene and N-alkylated carbazole derivatives.

Figure 1A:
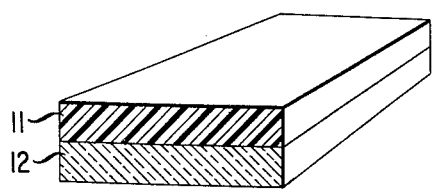
FIGS. 1A through 1D are perspective views of structures prepared in accordance with the described technique at various stages in the process.

With reference to FIG. 1A, film 11 of the doped liquid solution is deposited upon a smooth substrate support 12, typically a microscope slide, by conventional photoresist techniques. The solution is applied by means of a syringe or any similar means, until the surface thereof is flooded, excess liquid being permitted to drip off when the slide is maintained in a vertical position. Alternatively, excess liquid may be driven off by spin coating techniques.

Figure 1B:
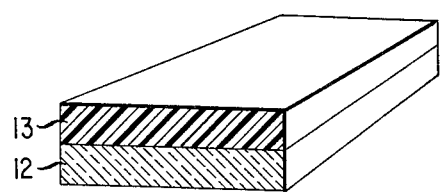
Figure 1C:
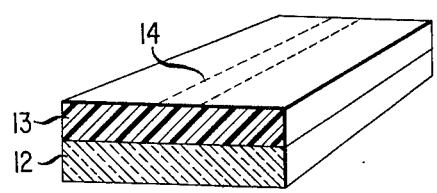

Following, the solvent evaporates and a solid doped polymer film 13 (FIG. 1B) results, thickness being determined by initial solid content of solution and procedure parameters. Then a desired optical circuit pattern is written in film 13 using a focused beam of radiation of a wavelength to which the dopant monomer is sensitive. The implementation of this step is effected as described in the noted patent by selective exposure of film 13 to yield an elongated high index region 14 (FIG. 1C) embedded in the central portion of the film.

Figure 1D:
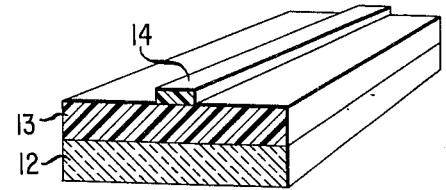

The final step of the processing sequence involves the development of the exposed circuit pattern by heating the film to a temperature sufficient to evaporate the unexposed portion of the dopant, thereby leaving the exposed portions of dopant in position in the film 13. The refractive index of film 13 being now intermediate that of the original undoped polymer and that of the dopant itself, the thickness is reduced in the unexposed regions due to removal of unexposed dopant so yielding the structures shown in FIG. 1D.

Employing the foregoing procedure, a liquid solution of the noted polymer including methoxyethyl acetate as the solvent was prepared. The liquid solution was doped to contain about 15% by weight of 2 naphthalenethiol, a photosensitive polynuclear aromatic thiol, which undergoes photochemical addition to the reactive side groups of the polymer upon exposure to radiation in the near ultraviolet portion of the spectrum.

The doped liquid solution was deposited upon a smooth, clear Pyrex plate and the solvent evaporated, so yielding a doped polymer film approximately one micron in thickness.

In order to further evaluate the described process, large areas of film were exposed with a mercury arc lamp. After exposure, the film was developed by baking at 100°C in a nitrogen atmosphere for a period of 1 hour. In the developed film, the exposed areas evidenced a refractive index approximately 1.3% higher and a thickness approximately 10% greater than in unexposed areas, the unexposed developed film evidencing a refractive index of about 1.515.

The refractive indices of the exposed and unexposed areas of the film were determined by coupling an optical beam into the film using a prism film coupler and measuring the synchronous angle. Losses in the film were measured by coupling a beam from a 633nm helium-neon laser into the film using a prism film coupler and coupling the beam out of the film by sliding along the propagation direction of the beam a prism riding on the upper surface of the film on a thin layer of index matching fluid. In the exposed and developed portions of the film a loss of 0.3 dB/cm was observed whereas unexposed and developed portions evidenced losses of 0.2 dB/cm. These values were comparable to those obtained in the process described in the aforementioned patent.

An optical waveguide was then written upon the film by exposure to a beam of ultraviolet radiation from an argon laser having a wavelength of 364nm and translating the plate perpendicular to the beam axis so as to trace out the desired waveguide pattern. At a wavelength of 364nm with an F/8.5 focusing and writing speed of 150$\mu$m/sec, a beam power of about 0.35 mW was required (giving a peak exposure of about 90 J/cm$^2$). The width of the described guides was approximately 4$\mu$m.

Coupling between parallel guides was demonstrated by writing a hairpin shaped guide with a straight guide parallel to one arm, a microscope objective and a prism film coupler being used to couple the 633nm beam from a helium-neon laser into the other arm of the hairpin. The light was then guided around the bend and coupled back and forth between the two parallel guides. Studies of interferograms of the coupling region revealed a smooth transition from curved guide to straight guide and there are distinct but slightly overlapping guides (4.1$\mu$m center to center spacing). The distance required for the guided energy to couple from one guide to the other (the coupling length) was observed to be as short as 150$\mu$m.

Photolocking gratings (grating couplers) were prepared by using a helium-cadmium laser ($\lambda = 325$nm), and an interferometer to produce an interference pattern with the desired fringe spacing. For 0.8$\mu$m gratings, films doped with naphthalene thiol evidenced a far greater response than any of the acrylate doped materials prepared in accordance with the process described in the aforementioned patent, such being in agreement with estimates of the resolution for the latter.

A plurality of gratings with 0.3 to 0.28$\mu$m periods were then written in the thiol doped material and output coupling strengths were measured for the 633nm beams guided through the films.

Figure 2:
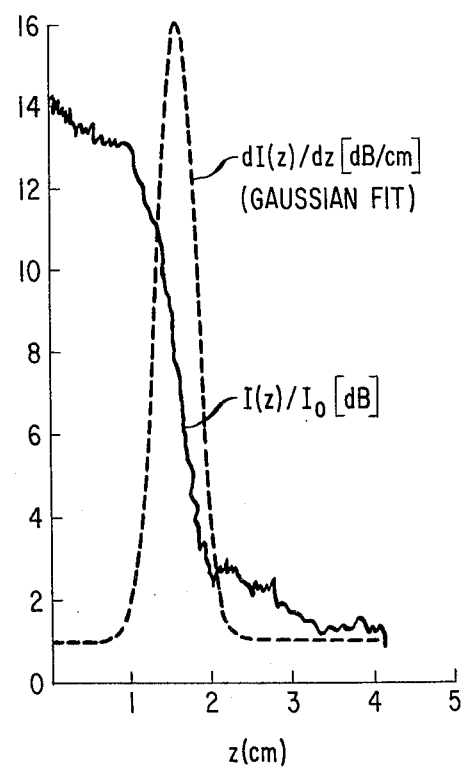
FIG. 2 is a graphical representation on coordinates of guided beam intensity in dB/cm against distance along the film in centimeters showing coupling strength of a typical grating coupler prepared in accordance with the present invention.

FIG. 2 is a typical experimental trace of the guided beam intensity as a function of position along the film and evidences a peak coupling strength of 15 dB/cm or a coupling length of 2.9mm. Holographic scattering efficiency, in both transmission and reflection was measured for a 521nm beam used at the Bragg angle. Analysis of the grating measurements revealed little modulation of film thickness with modulation of the refractive index of the film, the latter not being uniformly distributed throughout the thickness of the film.

What is claimed is:

1. In the method for the fabrication of an optical waveguide device comprising the steps of doping a liquid solution of transparent polymer in a solvent with a photosensitive monomer of higher index of refraction than that of said polymer, said monomer being capable of subsequent molecular structural changes which tend to lock said monomer in said polymer upon exposure to electromagnetic radiation of a selected wavelength, depositing a film of the doped liquid solution on a substrate support, evaporating the solvent from the solution, selectively exposing the film to said beam of radiation to lock said monomer in selected portions of said film and heating said film to reduce the unexposed monomer, the improvement which comprises utilizing a polynuclear aromatic thiol dopant.

2. Technique in accordance with claim 1 wherein said thiol is of the general formula

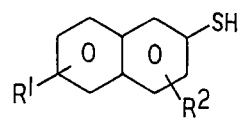

wherein $R^1$ is selected from among hydrogen and thiol groups and $R^2$ is selected from among chlorine, $C_1$–$C_2$ alkoxy groups and $C_1$–$C_2$ alkyl groups.

3. Technique in accordance with claim 1 wherein said dopant is 2 naphthalenethiol.

* * * * *